United States Patent [19]
Nicolas et al.

[11] Patent Number: 5,818,614
[45] Date of Patent: Oct. 6, 1998

[54] SINGLE-WAVELENGTH EMISSION DEVICE

[75] Inventors: Christophe Nicolas, Bicetre; Jean-Pierre Huignard, Paris; Frederic Naudan, Sevres, all of France

[73] Assignee: Thomas-CSF, Paris, France

[21] Appl. No.: 545,904

[22] Filed: Oct. 19, 1995

[30] Foreign Application Priority Data

Oct. 19, 1994 [FR] France .................................. 94 12487

[51] Int. Cl.$^6$ ....................................................... G03H 1/00
[52] U.S. Cl. .................................. 359/7; 359/15; 359/16; 359/19
[58] Field of Search .................. 359/7, 15, 19, 359/27, 16

[56] References Cited

U.S. PATENT DOCUMENTS

| | | | |
|---|---|---|---|
| 3,743,376 | 7/1973 | Russell | 359/15 |
| 4,063,795 | 12/1977 | Huignard et al. | 359/7 |
| 4,124,268 | 11/1978 | Micheron et al. | 359/6 |
| 4,286,838 | 9/1981 | Huignard et al. | 372/50 |
| 4,306,763 | 12/1981 | Huignard | 359/19 |
| 4,355,858 | 10/1982 | Funato et al. | 359/19 |
| 4,451,151 | 5/1984 | Huignard | 359/345 |
| 4,497,534 | 2/1985 | Sincerbox | 359/27 |
| 4,703,992 | 11/1987 | Yeh | 359/7 |
| 4,776,652 | 10/1988 | Ih | 359/16 |
| 4,878,718 | 11/1989 | Gilbreath-Frandsen et al. | 359/12 |
| 5,072,135 | 12/1991 | Huignard et al. | 359/327 |
| 5,075,573 | 12/1991 | Huignard et al. | 359/326 |
| 5,097,478 | 3/1992 | Verdiell et al. | 372/94 |
| 5,121,400 | 6/1992 | Verdiell et al. | 372/32 |
| 5,123,025 | 6/1992 | Papuchon et al. | 372/72 |
| 5,293,272 | 3/1994 | Jannson et al. | 359/3 |
| 5,394,412 | 2/1995 | Hugnard et al. | 372/9 |
| 5,602,657 | 2/1997 | Dickson et al. | 359/15 |

FOREIGN PATENT DOCUMENTS

| | | | |
|---|---|---|---|
| 0116896 | 8/1984 | European Pat. Off. | 359/19 |
| 4214014 | 11/1992 | Germany | 359/19 |

OTHER PUBLICATIONS

H.P. Herzig, "Holographic Optical Elements (HOE) for Semiconductor Lasers", Optics Comm., vol. 58, No. 3, Jun. '86.

ICIASF '89 International Congress on Intrumentation in Aerospace Simulation Facilities, Research Center Goettigen W. Germany, Sep. 18–21, 1989 pp. 595–601,XP000078170 H.D. Tholl et al., "Design and Fabrication of an Integrated Holographic Laser–Doppler Optics".

JETP–LETTERS, vol. 14, No. 1, 1971, New York Us Pages 17–20 M.S. Soskin et al., "Holographic Method of Aplitude–Phase Correction of Laser Beams".

AT&T Bell Laboratories Technical Journal, vol. 48, No. 9, Nov. 1969, New York Us Pages 2909–2947 H. Kogelnik "Coupled Wave Theory for Thick Hologram Gratings".

Optics Letters., vol. 10, No. 4, Apr. 1971, New York Us Pages 896–900 J.E. Ward et al "Lens Abberation Correction by Holography".

Patent Abstracts of Japan vol. 7, No. 166 (E–188, Jul. 21, 1985 & JP–A–58 071 686 (RICOH KK).

*Primary Examiner*—Jon W. Henry
*Assistant Examiner*—John Juba, Jr.
*Attorney, Agent, or Firm*—Oblon, Spivak, McClelland, Maier & Neustadt, P.C.

[57] ABSTRACT

This device comprises an optical source emitting a single-wavelength light beam. An index grating has been recorded in a holographic device by the interference of two plane light beams, both being beams at a single wavelength with one and the same determined value and being concurrent in the holographic device. The holographic device is illuminated by the light beam and delivers a single-wavelength beam whose radiation pattern has a limited angular passband. The wavelength of the reading beam may be different from that of the recording beams. Its orientation is then different from that of the beams.

10 Claims, 7 Drawing Sheets

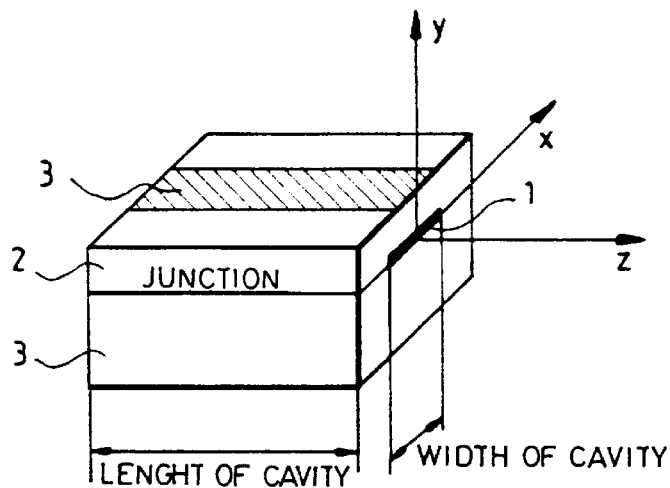
FIG.1
PRIOR ART
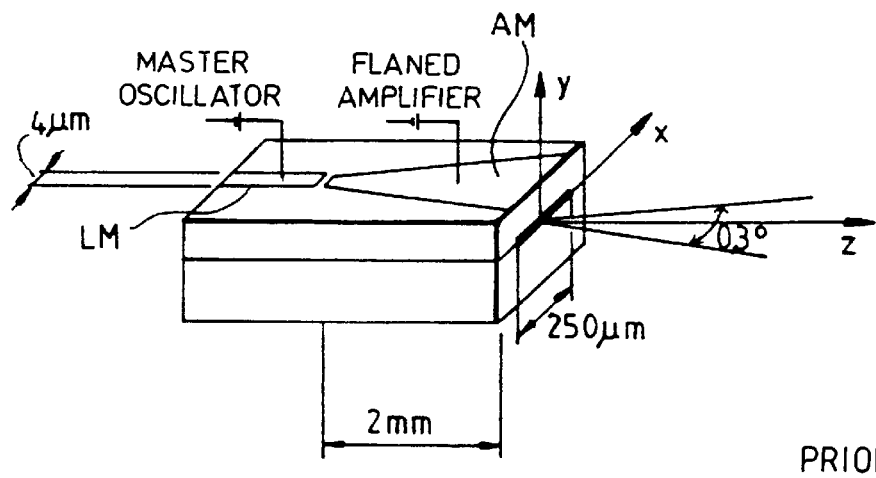
PRIOR ART
FIG.2
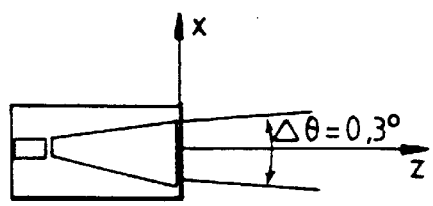
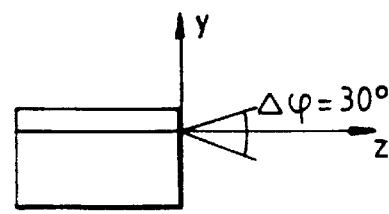
FIG.3a PRIOR ART FIG.3b

SINGLE-WAVELENGTH EMISSION DEVICE

BACKGROUND OF THE INVENTION

The invention relates to a single-wavelength emission device and more particularly to a device emitting a single-wavelength coherent beam whose radiation pattern has a narrow angular passband that is, for example, equal to or even lower than 0.3°.

A semiconductor laser produces a radiation for which the spatial and temporal coherence values as well as the power depend on the geometry of the resonant cavity.

FIG. 1, representing such a laser, shows the transversal direction y perpendicular to the plane xy of the laser junction and the lateral direction x, parallel to the laser junction (see FIG. 1). The mean direction of light emission z is thus parallel to the plane of the laser junction.

In the transversal direction y, the cavity is demarcated by the thickness of the active zone 1 which is very small, i.e. smaller than one micrometer. The confinement of the wave is provided by the great difference between the refraction index of the active layer 1 and the refraction indices of the confinement layers 2 and 3. It is said in this case that there is index guidance. In general, in the plane yz, only one mode of oscillation is permitted by this transversal guidance. It is said then that the laser is a transverse monomode laser.

In the lateral direction x, the cavity is demarcated either by index guidance or by gain guidance. In the latter case, it is the flow of injected electrical current through the active layer (for the electrode 3) that laterally demarcates the laser gain zone. For a given cavity length, the greater the width of the cavity, the more powerful and the less coherent is the laser. Indeed, the wider the cavity, the greater is the number of lateral oscillation modes. The laser becomes a lateral multimode laser.

The lateral multimode character is expressed by a complex radiation pattern (a multiple-lobe pattern), a relatively great geometrical range, and a multiple-frequency emission spectrum. In order to have a maximum level of optical power available in the smallest possible solid angle, using semiconductor components, three techniques are implemented, enabling the compactness of the source to be maintained:

i) Making a coherent addition of the light fluxes of several monomode lasers. For this purpose, a network of integrated lasers is manufactured in a monolithic component with controlled coupling of the lasers with one another.

ii) setting the oscillation of a wide cavity laser on a single lateral mode: by replacing the laser electrode with an array of thin electrodes and/or by the injection, into the wide cavity, of the beam of a low-power monomode laser.

iii) Amplifying the radiation of a monomode laser by means of a semiconductor component designed to maintain the modal quality of the beam.

The invention which shall be described applies to the different types of "highly coherent" sources and more particularly to the third category which is taken as a significant example.

The last-mentioned approach appears to be the most promising one. It is the approach with the MOPA (Master Oscillator Power Amplifier) structure as described for example in the article by Stephen O'Brien et al., "Operating Characteristics of a High-Power Monolithically Integrated Flared Amplifier Master Oscillator Power Amplifier", IEEE Journal of Quantum Electronics, Vol. 29, No. 6, June 1993.

In its more elaborate version (see FIG. 2), a monomode laser LM and a flared amplifier AM are integrated on one and the same component.

The monomode laser LM and the amplifier AM share the same junction. The coupling between the laser and the amplifier is optimized. The active zone of the amplifier is demarcated laterally by the flared shape of its electrode. This shape enables the amplification of the laser beam while at the same time preserving its high modal quality.

The coherent sources obtained by the three techniques mentioned here above are characterized by a relatively narrow radiation pattern. Their geometrical range is close to the value $E_o = \lambda^2$ where $\lambda$ is the wavelength of the radiation.

For example, for a MOPA at the wavelength $\lambda=975$ nm and for an emissive zone width L=250 µm, the angular pattern of lateral radiation in the plane xz is formed ideally by a lobe with a width at mid-height (see FIG. 3a)=$\Delta\theta=0.3°$.

In the plane yz, for an emissive zone height of less than one micrometer, the pattern of transverse radiation is far wider(see FIG. 3b)=$\Delta\psi \approx 30°$.

The imperfections of the coherent sources lead to a deterioration of the lateral radiation pattern which is expressed, for example, by the appearance of "feet" (or cases of secondary emission) on either side of the major lobe of radiation (FIG. 4).

Furthermore, a modification of the operating conditions may lead to a harmful modification of the radiation pattern such as the widening of the major lobe or an increase in the quantity of the off-passband radiation $\Delta\theta$.

One conventional technique used to preserve a narrow radiation pattern and, consequently, high spatial coherence consists of the addition, to the coherent source, of an optical system of spatial filtering constituted by lenses and a diaphragm with a slit as shown in FIGS. 5a and 5b. The slit DP is oriented in a direction perpendicular to the plane of the junction of the laser SC.

According to FIG. 5a which shows the system in a view (plane xz) perpendicular to the direction of the slit DP, the beam coming from the coherent source SC is slightly divergent (for example $\Delta\theta=0.3°$ plus the "feet" of the pattern). A lens $L_1$ forms a spot with a size $d = f_1 \cdot \Delta\theta$ at its image focus $F_{1'}$.

A filtering slit, with an aperture equal to d, is positioned at $F_{1'}$. It lets through only the light flux corresponding to the major lobe. A cylindrical convergent lens $L_2$, whose object focus $F_2$ coincides with $F_{1'}$, enables the collimation of the rays that pass through the aperture of the slit. Thus the total radiation pattern is limited to its useful part contained in the angular passband (major lobe):

$$\Delta\theta_2 = \frac{d}{f_2}$$

The relationship of angular magnification is:

$$\frac{\Delta\theta_2}{\Delta\theta_1} = \frac{f_1}{f_2}$$

FIG. 5b shows the system in a view (plane yz) parallel to the slit DP. In this figure, the same lens $L_1$ makes a direct collimation of the rays (in the plane yz) provided that its object focus corresponds with the emissive zone of SC. Since the source is generally a monomode source in the plane yz, no system of spatial filtering is needed. This is why the lens $L_2$ is cylindrical.

As can easily be seen, the spatial filtering system considerably increases the total complexity of the source. Indeed, it must be considered that the coherent source is formed by the semiconductor-based emissive sub-unit and the optical filtering system.

In order that the aperture of the filtering slit may have a reasonable size from the mechanical viewpoint, the focal distances $f_1$ and $f_2$ need to be relatively great.

For example, such a system may be formed with the following numerical values:

$$f_1 = 6 \text{ mm } d = 0 \text{ } \mu m$$

The second lens $L_2$ must have a relatively great focal distance in order to enable the insertion of the slit. This implies an increase in the general amount of space required. Thus, there are MOPA+filter assemblies available whose overall length is in the range of 20 cm.

If it is desired to use a micro-lens for $L_1$, the slit should have a very small aperture:

$$f_1 = 500 \text{ } \mu m ===> d = 3 \text{ } \mu m.$$

This certainly raises many mechanical problems in terms of positioning.

Each filtering slit must be adjusted with precision as a function of the MOPA used. Furthermore, any modification of the mean direction of emission of the semiconductor-based source makes the slit inoperative.

The light flux that is not transmitted by the slit is permanently lost. It may even return to the source SC by reflection and thus disturb its working.

The invention which shall now be described removes the need to use a filtering slit and enables a considerable reduction in the total amount of space required by the source.

The MOPA structure is the most powerful semiconductor-based laser source having maximum coherence. The available energy flow is typically 1 watt at the wavelength $\lambda=975$ nm. The radiation pattern is limited by the diffraction because its width at mid-height is $\lambda\theta=0.3°$ in the direction parallel to the junction for an aperture of 250 $\mu$m.

Such a laser, associated with a filtering system as shown in FIGS. 5a, 5b should give a high-quality beam. However, the spatial filtering is effective only for a determined operating point of the laser.

Unfortunately, in getting heated, the laser is the site of phenomena relating to heat gradient and to nonuniform saturation of the gain in the amplifier. These phenomena induce a curvature of the phase leading edge and even to an irregular curvature. As we have just seen, the spatial filtering slit may be adjusted (in terms of dimensions and positions) for a given operating point. As soon as the power of the laser changes, the system is no longer appropriately filtered. The light energy is no longer centered on the slit and the total flow of the "filtered" beam diminishes.

The invention enables this drawback to be overcome.

SUMMARY OF THE INVENTION

The invention therefore relates to a single-wavelength emission optical device comprising an optical source emitting a single-wavelength light beam, wherein said device comprises a holographic device in which an index grating has been recorded by the interference of two plane light beams, both being beams at a single wavelength with one and the same determined value and being directed in two concurrent directions in the holographic device. The holographic device is illuminated by said light beam.

The invention also relates to a device wherein the holographic device makes transmission, in a first direction, of a first plane beam whose radiation pattern is contained in a determined angular band ($\Delta\theta$) and makes transmission, in a second direction, of a second beam or several beams whose radiation pattern is located outside this angular band. This device also has a reflection device enabling the first and second beams to be made concurrent as well as an energy transfer device located in the zone of interference of the two beams. This device transfers energy from the second beam to the first beam without any resultant modification of the radiation pattern of this first beam.

BRIEF DESCRIPTION OF THE DRAWINGS

The different features and characteristics of the invention shall appear more clearly from the following description and from the appended figures, of which:

FIGS. 1 to 4 are prior art semiconductor laser sources as described here above;

DETAILED DESCRIPTION OF THE INVENTION

Figure 6A:
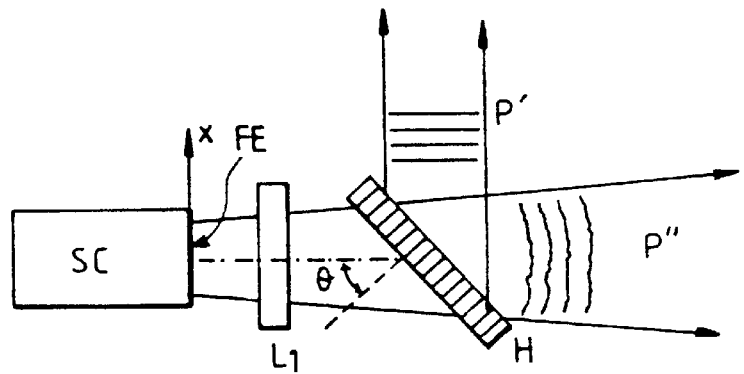
FIGS. 6a and 6b show an exemplary embodiment of the system of the invention.
Figure 6B:
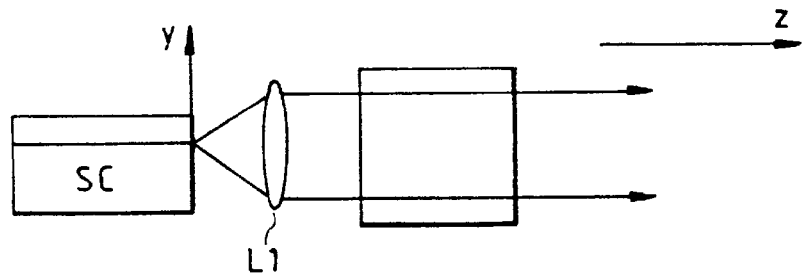
Figure 7:
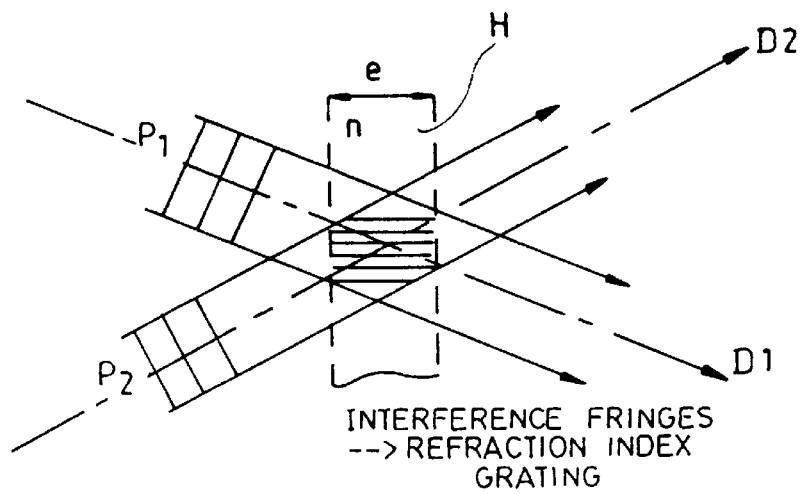
FIGS. 7, 8a, 8b and 9 show an exemplary embodiment of the holographic device used in the system of FIGS. 6a and 6b.

Referring to FIGS. 6a and 6b and then to FIGS. 7 and 8, a description shall be given first of all of a general exemplary embodiment of the system of the invention.

As shown in FIGS. 6a and 6b, a holographic device H is associated with the monochromatic source SC. The positioning and function of this holographic device H shall be described here below. We shall first of all describe the way in which it is made.

The holographic device is made as follows: a photosensitive medium H is subjected to two plane beams P1, P2 having the same wavelength (see FIG. 7) intersecting in the photosensitive medium that is transparent to this wavelength. In the zone in which the two beams overlap, they interfere with each other and create interference fringes whose direction is the bisector of the directions of the plane beams.

The optical medium is a photosensitive material whose refraction index is affected by the light intensity. A modulation of the refraction index is created, with an amplitude dn that is in correspondence with the modulation of light intensity resulting from the interference fringes. Let it be assumed that this index modulation can be recorded permanently. A hologram has been recorded in the volume of the medium n (with a thickness e).

Figure 8A:
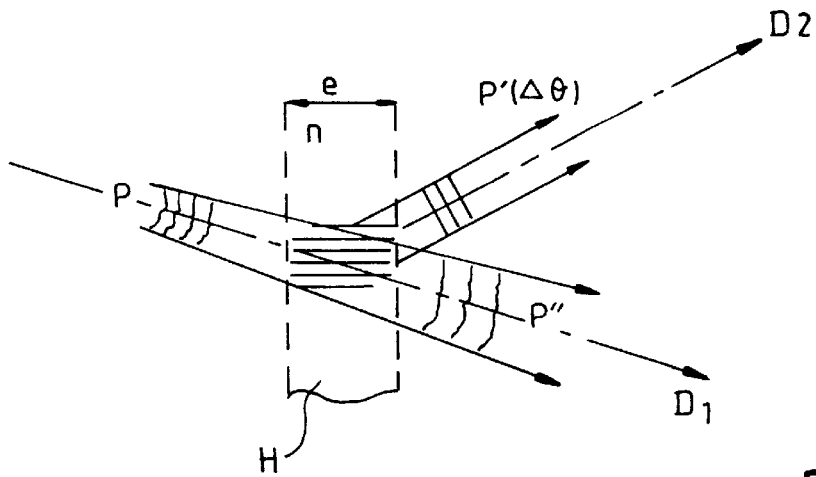

According to FIG. 8a, the hologram thus recorded is then illuminated by a beam P practically identical to the beam $P_1$ but with the wave front deteriorated and along the same direction as the beam $P_1$. The diffraction of the beam P on the hologram creates a beam P' with the same geometry as the preceding beam $P_2$ that has been used for the recording. The beam P' is therefore a plane beam having the same radiation pattern as the beam $P_2$.

The hologram is indeed characterized by an angular passband $\Delta\theta$ according to Bragg's diffraction law. The efficiency of the diffraction in the passband $\Delta\theta$ may be close to 100% under certain geometrical conditions and for certain values of dn.

The energy complement corresponding to the degraded part of the wave front of P is transmitted without diffraction by the hologram (beam P"). It is the part of the beam P that is outside the passband $\Delta\theta$.

Thus, there is obtained an angular filtering function, in the passband $\Delta\theta$, of the pattern of P. The addition of this holographic angular filter to a semiconductor-based quasi-coherent emitter source, as is done in the system of FIGS. 6a an 6b, enables the creation of an optical source with the radiation pattern limited by $\Delta\theta$.

Figure 9:
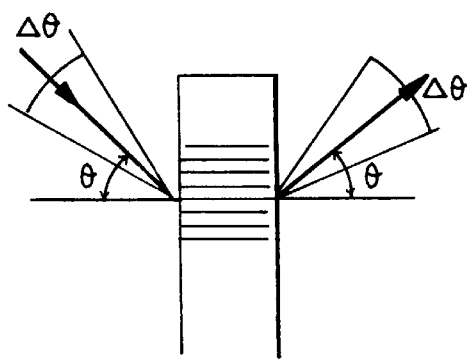

Computations made according to the coupled wave theory (H. Kogelnik, "Coupled Wave Theory For Thick Hologram Gratings", The Bell System Technical Journal, Vol. 48, No. 9, pp. 2909–2947, November 1979) show that it is possible to obtain a high level of diffraction efficiency of up to 0.95 in a passband $\Delta\theta=0.3°$ in the configuration shown in FIG. 9, with, for example, the following values:

$\theta=45°$ $n=1.5$ $dn=0.003$ $e=100 \mu m$ $\lambda=975$ nm the interfringe distance $\Lambda$: 0.46 $\mu m$ In the system of FIGS. 6a and 6b, the holographic device H which takes the form of a plane layer of a photosensitive material is oriented perpendicularly to the plane of the junction of the semiconductor laser SC and forms a determined angle with the plane containing the emissive face FE of the junction. As can be seen in FIG. 6a, the normal to the plane of the holographic device H forms an angle $\theta$ with the mean direction of emission of the beam emitted by the laser SC.

FIG. 6b shows a top view of the system of FIG. 6a.

Figure 4:
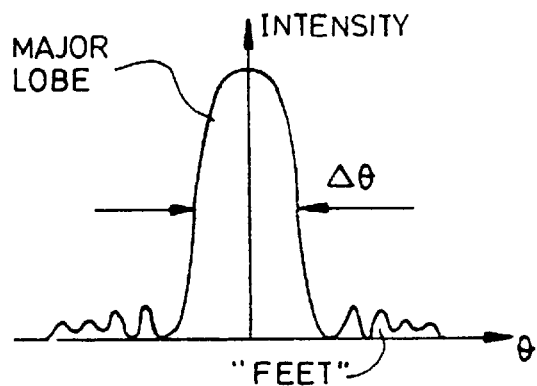
Figure 5A:
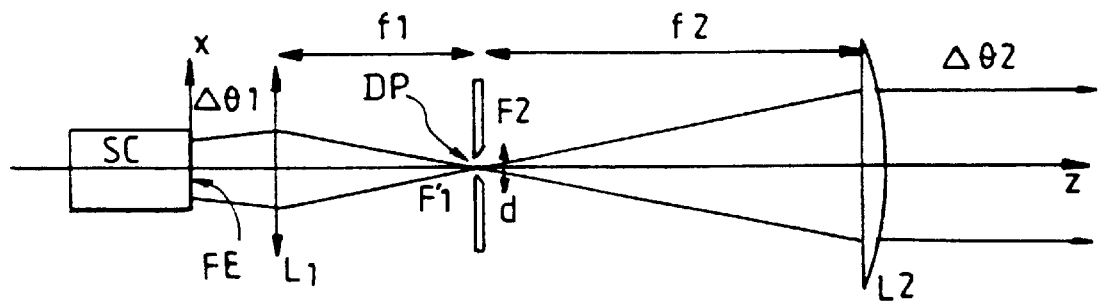
FIGS. 5a and 5b show a system of angular filtering to improve the radiation pattern of a laser.
Figure 5B:
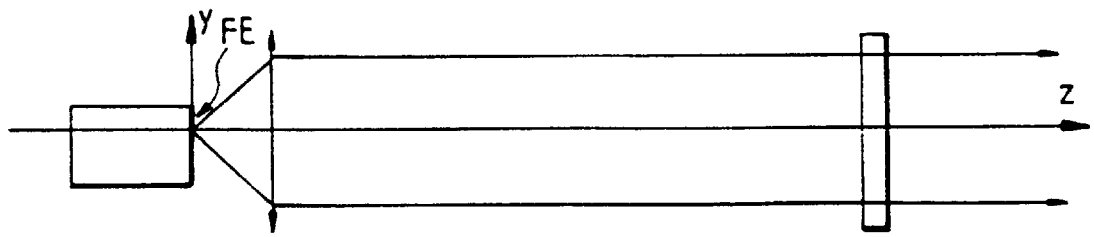

In this system, since there is no longer any filtering slit as in the system of FIGS. 5a, 5b, the collimation lens L1 may be cylindrical. It is convergent for the transversal plane only (yz) and has a very short focal distance. In particular, there are known ways of positioning a cylindrical micro-lens at a very small distance (several hundreds of micrometers) from the emissive surface of SC.

The holographic device may be made, for example, with one of the following materials:

bichromated gelatine, photopolymer, photosensitive crystal ($LiNbO_3$).

The recording of the holographic device according to FIG. 7 may be done by means of beams P1, P2 given either by a low-power monomode laser or by a MOPA type laser source at an operating temperature that is perfectly identified and that can therefore be filtered according to the system of FIGS. 5a, 5b. The two beams P1, P2 may be given by one and the same source. A system of onward reflection by means of a mirror can easily be set up by making these two beams interfere according to a determined angle in the photosensitive medium.

Figure 8B:
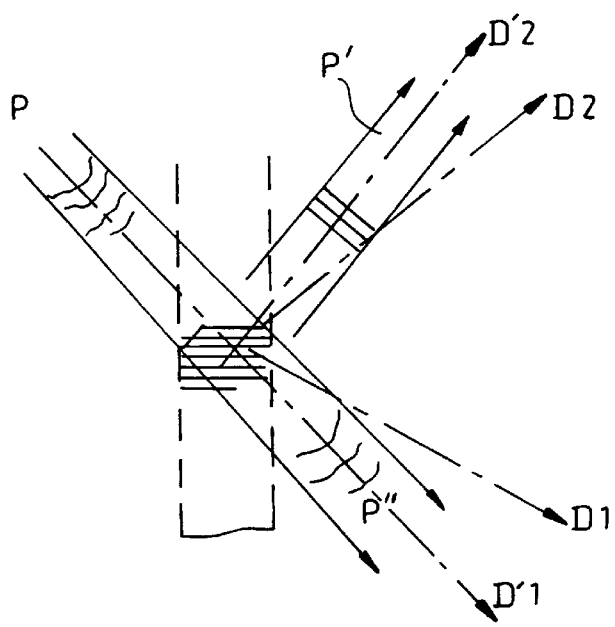

As we have seen here above, the recording of the hologram in the device H is done by means of two beams having the same wavelength (see FIG. 7). By contrast, the reading of the hologram may be done with a beam of another wavelength. In FIG. 8, the beam P may have a wavelength different from that of P1 and P2. In this case, the direction of the beam P is different from that of the beam P1. As shown in FIG. 8b, the beams P and P'" are directed in a direction D'1 different from D1. The diffractive beam P' therefore also has a direction D'2 different from the direction D2 of FIG. 7. To obtain a maximum efficiency of diffraction of the beam P in the direction D'2, it is necessary to adjust the direction of the incidence D'1 of the beam P on the holographic device.

Figure 15:
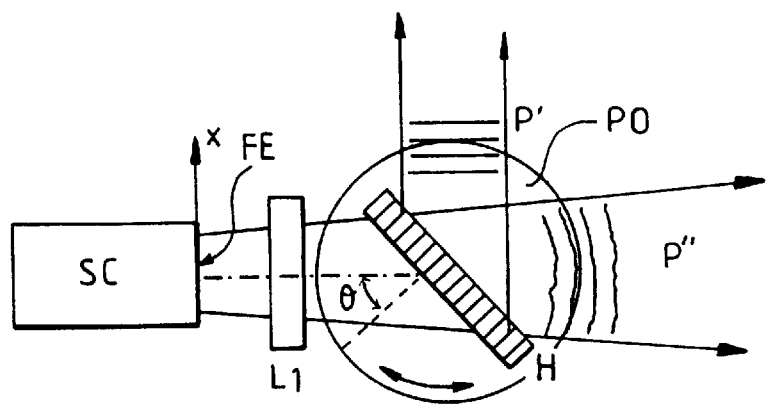
FIG. 15 shows a variant of an embodiment enabling an adjustment of the efficiency of diffraction of the system.

FIG. 15 provides for the attachment of the holographic device H to a swivelling deck PO that enables the angle of incidence $\theta$ to be varied in order to obtain an optimal setting of the efficiency of diffraction of the beam P.

Preferably, the hologram is recorded at a wavelength that is visible in photopolymer.

Again preferably, the holographic device H is a hologram that is thick so that it can be selective in terms of wavelengths. Its thickness (100 $\mu m$ for example) is chosen so that there is an overlapping of the recording beams throughout its thickness.

According to one embodiment, the collimation lens $L_1$ may be made in the form of a holographic lens.

Figure 10A:
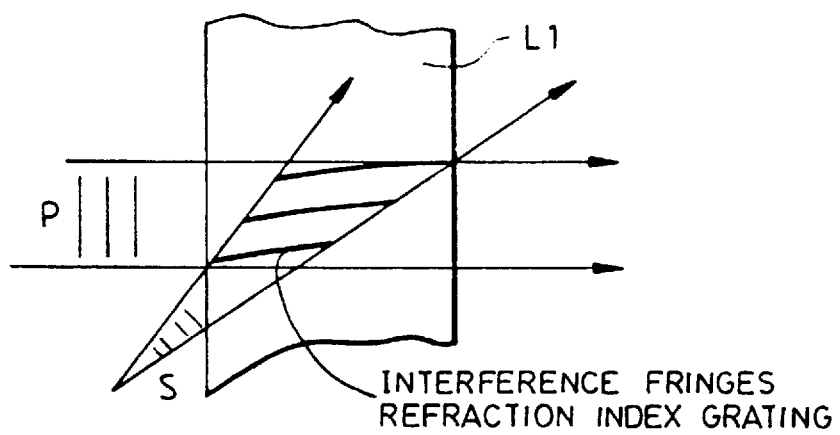
FIGS. 10a and 10b show an exemplary embodiment of the collimation lens of the system of FIGS. 6a and 6b.

There is a known way of manufacturing holographic lenses, especially cylindrical lenses. The lens $L_1$ may also be formed by a thick hologram. The principle of such a lens is described in FIG. 10a.

Figure 10B:
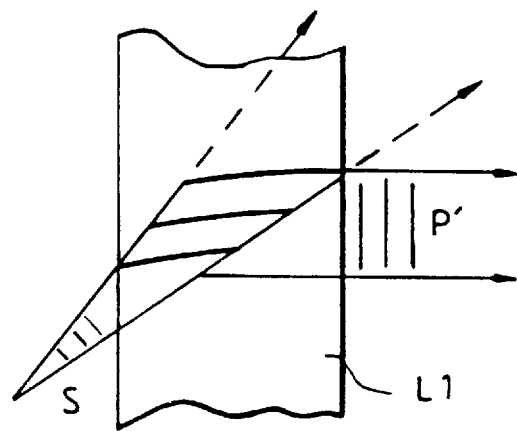

At recording, a plane beam P is made to interfere with a cylindrical or spherical beam S. The interference fringes obtained are parabolic. When restored, the hologram is illuminated by the beam S and the beam P' is obtained by diffraction: this beam P' is identical to the plane beam P (FIG. 10b).

The two holographic components formed by the lens $L_1$ and the holographic device H may be attached to each other.

Figure 11:
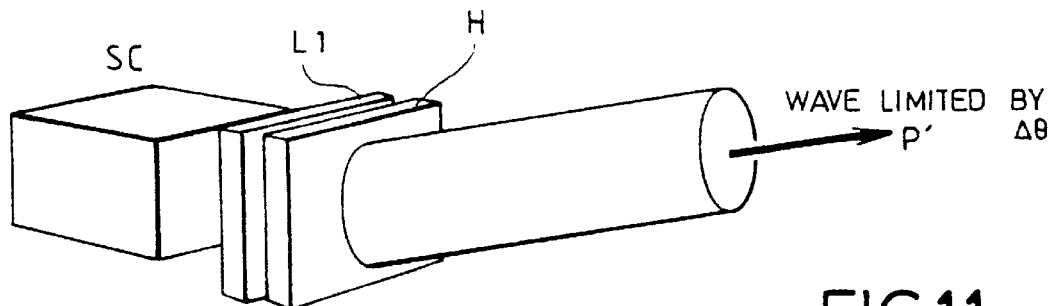
FIG. 11 exemplifies a joining of the elements of the system of the invention.

The two functions may also be recorded in one and the same component. The same thick hologram may perform both functions: that of a lateral angular filter and that of a transverse convergent lens. This can be achieved, for example, by making a beam equivalent to the ideal beam that would come from a MOPA with the beam that it is desired to obtain after collimation and filtering as shown in FIG. 11. These beams may be obtained by means of an ancillary monomode laser (that is not necessarily semiconductor-based) provided with an optical system that enables the simulation of an ideal MOPA beam.

Figure 12:
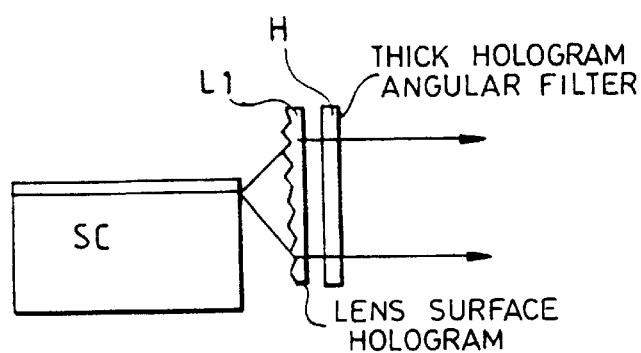
FIG. 12 shows another form of an embodiment of the invention wherein the lens L1 is a surface hologram.

There is a known way of manufacturing lenses according to the technique of surface holograms or relief holograms. In this case, a modulation of the thickness of the photosensitive medium H is recorded. The surface hologram $L_1$ may be associated with the volume hologram H which is used as an angular filter (FIG. 12).

Figure 13:
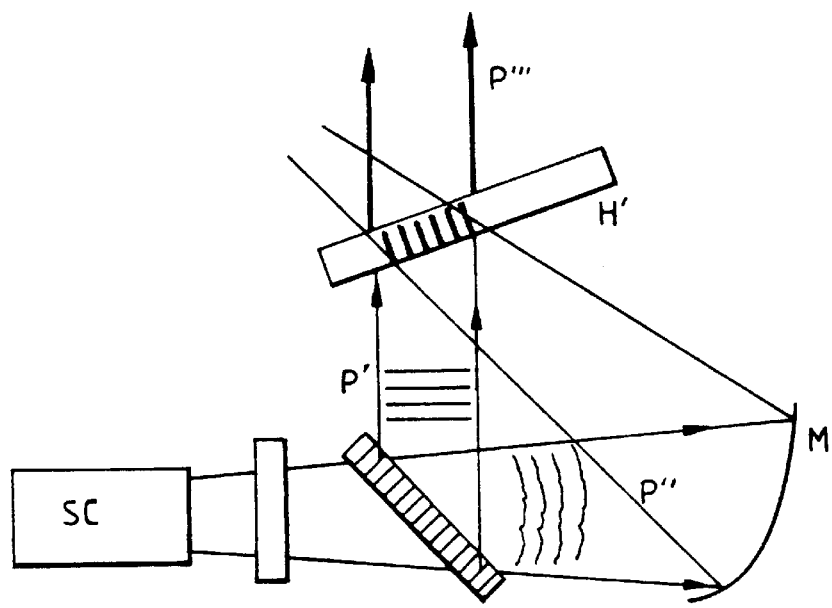
FIG. 13 shows a variant of an embodiment of the invention enabling the energy efficiency of the system to be improved.

FIG. 13 shows an alternative embodiment of the invention wherein the light energy of the beam P" of the system of FIGS. 6a and 6b is recovered. Indeed, in FIGS. 6a and 6b, the light beam P" is lost.

The beam P' is the useful beam, limited in the angular band $\Delta\theta$. The beam P", corresponding to the off-passband $\Delta\theta$ flux, is characterized by the same wavelength λ as P'. Consequently, P' and P''' are likely to interfere with each other. According to the variant of FIG. 13, by means of a mirror M, the beams P' and P'' are made to intersect in such a way that, in a zone of space, they create a grating of interference fringes, namely a periodic modulation of light intensity. In the interference zone, a thick hologram H' is placed wherein there is recorded a periodic modulation of its refraction index that has the same period as the fringes but is phase-shifted by π/2 with respect to the fringes. It is then possible to observe the addition of the fluxes of P' and P''' in the direction of P'. The resultant beam P'''has the same geometrical characteristics as P' (phase leading edge and Δθ) but an intensity amplified with respect to P' (at the expense of the intensity of P''). This variant thus enables an increase in the light flux along P''' in the passband Δθ.

The π/2 phase-shift needed for this transfer may be obtained by translation of the hologram H' with respect to the interference fringes.

Instead of the pre-recorded hologram, it is possible to use a photorefractive crystal according to the two-beam mixing technique. Thus, the interference fringes of P' and P'', localized in the crystal, create the index modulation that is automatically phase-shifted by π/2 with respect to the fringes under the effect of the electrical fields internal to the crystal.

The material used for the device H' of FIG. 13 may be of the same type as that used for the device H of FIGS. 6a, 6b in the case of a pre-recorded hologram.

In the case of a device of the two-beam mixing type, it is possible to use photorefractive crystals such as $BaTiO_3$ or CdTeV.

Figure 14:
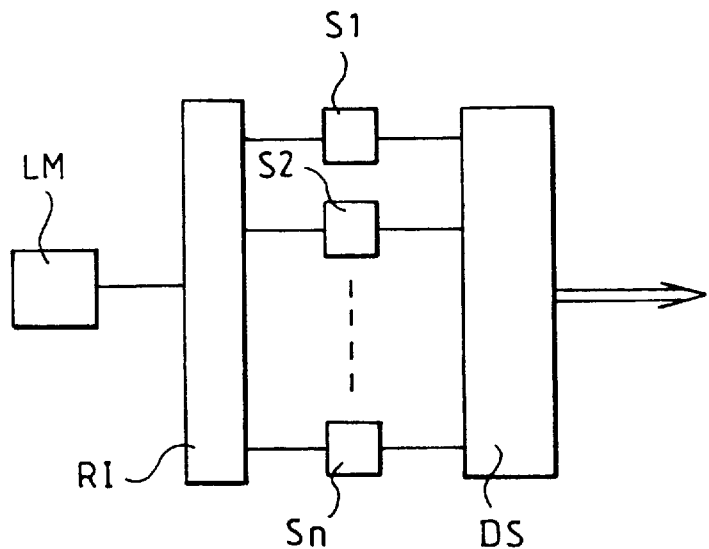
FIG. 14 shows a variant of an embodiment of the laser source SC.

FIG. 14 shows an alternative embodiment in which the source SC is formed by several sources S1, S2, . . . , Sn (enslaved lasers) pumped by a master laser source LM. A beam splitter RI distributes the beam from the master laser to the different enslaved lasers. The beams put out by the enslaved lasers are superimposed in a superimposing device DS to give a quasi-coherent single-wavelength beam λ. It is this beam that is transmitted to the holographic device of FIGS. 6a, 6b.

The invention therefore consists of a coherent optical source comprising a semiconductor-based emissive sub-unit producing a beam close to the diffraction limit and one or more holograms of the "thick" type (or volume holograms) acting as an angular filter.

Whatever may be the conditions of operation of the semiconductor-based emitter, the holographic filter limits the angular range of the flux to a passband corresponding to the limit of diffraction.

Furthermore, the holographic filter enables the flux emitted off-passband to be recovered and enables it to be returned to the passband by another beam mixing device.

The invention has the following advantages:

Compactness

Since the operation relates to a filtering of rays according to their direction of propagation and since there is no need to plan for a focal distance for the holographic device, this device may be in contact with the lens $L_1$ (in FIGS. 6a, 6b).

Ease of manufacture and low cost of this system: the manufacture of the hologram is similar to that of a photographic exposure.

Positioning tolerance since it is the angular directions that are filtered and no longer a narrow spot. Only the orientation of the index grating with respect to the incident beam, hence with respect to the holographic device, is critical. This rotation is also equivalent to an adjusting of the angular filter with respect to the wavelength of the laser SC.

There is no reflection of the off-passband energy towards the laser source SC.

What is claimed is:

1. A single-wavelength emission optical device comprising:

an optical source emitting a single-wavelength light beam; and a prerecorded holographic angular filter device receiving said single-wavelength light beam whereby the holographic angular filter device effects diffraction, in a first direction, of a first portion of said received light beam as a first planewave beam having a radiation pattern contained in a determined angular band (Δθ) and effects transmission, in a second direction, of a second portion of said received light beam as at least one second beam wherein each of said at least one second beam has a radiation pattern located outside said determined angular band wherein said device further comprises a reflection device and an energy transfer device whereby said reflection device enables the first and second beams to intersect and said energy transfer device, located in a zone of interference of the two light beams, transfers energy from the second beam to the first beam without any modification of the radiation pattern of said first beam.

2. A device according to claim 1, comprising means for the orientation of the holographic angular filter device with respect to the direction of incidence of said single-wavelength beam so as to set the angle of incidence of this beam with respect to the holographic angular filter device.

3. A device according to claim 1, comprising a lens between the optical source and the holographic angular filter device enabling the transmission, to the holographic angular filter device, of a substantially collimated light beam.

4. A device according to claim 3, wherein the source comprises a semiconductor laser and wherein the lens is cylindrical, its cylindrical axis being parallel to the plane of the junction of the laser.

5. A device according to claim 3, wherein the laser source has semiconductor lasers, each pumped by a master laser and each emitting a laser beam in parallel, a device for the superimposition of beams receiving these different beams and emitting a single beam.

6. A device according to claim 3, wherein the lens is a holographic lens with an index grating.

7. A device according to claim 6, wherein the holographic lens is attached to the holographic angular filter device.

8. A device according to claim 6, wherein the holographic lens and the holographic angular filter device are recorded in one and the same holographic angular filter device.

9. A device according to claim 3, wherein the lens is a surface relief holographic lens.

10. A device according to claim 1, wherein the energy transfer device is a two-beam mixing photorefractive crystal.

* * * * *